United States Patent [19]
Kato et al.

[11] Patent Number: 5,742,212
[45] Date of Patent: Apr. 21, 1998

[54] HIGH-FREQUENCY SWITCH

[75] Inventors: Mitsuhide Kato, Shiga-ken; Norio Nakajima, Takatsuki, both of Japan

[73] Assignee: Murata Manufacturing Co., Ltd., Japan

[21] Appl. No.: 760,523

[22] Filed: Dec. 5, 1996

[30] Foreign Application Priority Data

Dec. 5, 1995 [JP] Japan ................... 7-316724

[51] Int. Cl.$^6$ .................. H01P 1/15; H01P 5/12
[52] U.S. Cl. .................. 333/104; 455/83
[58] Field of Search ................... 333/103, 104; 455/80, 82, 83

[56] References Cited

U.S. PATENT DOCUMENTS 5,519,364  5/1996  Kato et al. ................ 333/103

FOREIGN PATENT DOCUMENTS 6-197042  7/1994  Japan ................ 455/83

*Primary Examiner*—Paul Gensler
*Attorney, Agent, or Firm*—Ostrolenk, Faber, Gerb & Soffen, LLP

[57] ABSTRACT

A high-frequency switch in which required resistors can be mounted without hampering the characteristics of the switch. The high-frequency switch has a series circuit formed of a first diode and a first transmission line with a node E therebetween. The first diode is connected to a transmitting circuit through a capacitor at a node A. One end of the first transmission line is coupled to a receiving circuit via a capacitor at a node B. A second transmission line and a capacitor with a node C therebetween are connected between the node A and a ground potential, while a second diode and a capacitor with a node D therebetween are coupled between the node B and a ground potential. A series circuit formed of first and second resistors with a node F therebetween is connected between the nodes C and D. A first control voltage terminal Vc1 is coupled to the node C via a resistor, while a second control voltage terminal Vc2 is connected to the node D via another resistor. An antenna ANT and the node E are connected to the node F.

14 Claims, 5 Drawing Sheets

HIGH-FREQUENCY SWITCH

BACKGROUND OF THE INVENTION

1. Field of the Invention

The present invention relates to a high-frequency switch and, more particularly, to a high-frequency switch for changing signal paths in a high-frequency circuit of, for example, a digital mobile cellular telephone.

2. Description of the Related Art

A typical high-frequency switch, as shown in FIG. 9, is used in a digital mobile cellular telephone for connecting a second port P2 (antenna ANT) either to a first port P1 (transmitting circuit Tx) or to a third port P3 (receiving circuit Rx).

FIG. 10 is a circuit diagram of one example of a conventional high-frequency switch. In a high-frequency switch generally designated by 1, the first port P1 is connected to the transmitting circuit Tx; the second port P2 is coupled to the antenna ANT; and the third port P3 is connected to the receiving circuit Rx. Connected to the transmitting circuit Tx through a capacitor 2a is the anode of a first diode 3a which is grounded via a series circuit formed of a first transmission line 4a and a capacitor 2b. A first control voltage terminal 6a is connected across a resistor 5a to the node between the first transmission line 4a and the capacitor 2b. A first control circuit (not shown) for changing the switch 1 is connected to the first control voltage terminal 6a. The cathode of the first diode 3a is coupled to the antenna ANT through a capacitor 2c. A resistor 5b is further connected in parallel to the first diode 3a.

Moreover, a second transmission line 4b is connected at one end to the antenna ANT through the capacitor 2c and at the other end to the receiving circuit Rx through a capacitor 2d. The anode of a second diode 3b is coupled to the node between the second transmission line 4b and the capacitor 2d. The cathode of the second diode 3b is grounded via a capacitor 2e. A resistor 5c is connected in parallel to the second diode 3b. Moreover, a second control voltage terminal 6b is coupled across a resistor 5d to the node between the second diode 3b and the capacitor 2e. A second control circuit (not shown) for changing the high-frequency switch 1 is connected to the second control voltage terminal 6b.

An explanation will now be given of the transmitting and receiving operation performed by the high-frequency switch 1.

For transmission, a positive voltage is applied to the first control voltage terminal 6a, while 0 [V] is applied to the second control voltage terminal 6b. At this time, since the capacitors 2a through 2e interrupt the flow of a direct current, the voltage applied to the first control voltage terminal 6a is only applied to a circuit portion including the first and second diodes 3a and 3b. The first and second diodes 3a and 3b can thus be activated. This makes it possible to transmit a signal from the transmitting circuit Tx to the antenna ANT which then radiates from the antenna ANT. Further, an impedance inverting circuit is formed by causing the second transmission line 4b to be grounded via the second diode 3b and the capacitor 2e. Accordingly, the impedance viewed from the node between the cathode of the first diode 3a and the second transmission line 4b to the receiving circuit Rx is caused to become very large. As a result, the signal sent from the transmitting circuit Tx cannot be transmitted to the receiving circuit Rx.

Conversely, for reception, 0 [V] is applied to the first control voltage terminal 6a, while a positive voltage is applied to the second control voltage terminal 6b, so that the first and second diodes 3a and 3b are rendered ineffectual. A received signal is thus transmitted to the receiving circuit Rx rather than to the transmitting circuit Tx.

In this manner, transmission and reception can be changed in this high-frequency switch 1 by controlling the voltages to be applied to the first and second control voltage terminals 6a and 6b.

However, in this known type of high-frequency switch 1, it is required that the resistors 5b and 5c be connected in parallel to the first and second diodes 3a and 3b, respectively, thereby restricting the flexibility of designing the switch 1. In particular, for forming the switch 1 by the use of a multilayered substrate, if the first and second diodes 3a and 3b are mounted on a multilayered substrate, the resistors 5b and 5c are also required to be mounted or printed on the substrate. This increases the manufacturing cost.

Additionally, if a multilayered substrate partly forming the switch 1 is mounted with the resistors 5b and 5c on a printed circuit board, wiring is required for the resistors 5b and 5c. This lowers the electrical characteristics of the high-frequency switch 1, thereby causing the switch to fail to achieve desired characteristics.

SUMMARY OF THE INVENTION

Accordingly, it is an object of the present invention to provide a high-frequency switch, free from the above-described problems, in which required resistors can be mounted on a printed circuit board without hampering the characteristics of the switch.

In order to achieve the above object, according to one aspect of the present invention, there is provided a high-frequency switch having first through third ports in which the second port can be connected either to the first port or to the third port, the high-frequency switch comprising: a series circuit formed of a first transmission line and a first diode which is connected between the first and third ports; a second transmission line connected between a reference potential and the node of the first port and the first diode; a second diode connected between a reference potential and the node of the third port and the first transmission line; a series circuit formed of first and second resistors connected between the node where the second transmission line is coupled to the reference potential, and the node where the second diode is coupled to the reference potential; a first control voltage terminal connected to one end of the first resistor; and a second control voltage terminal connected to one end of the second resistor, wherein the node between the second port, the first diode and the first transmission line is connected to the node between the first and second resistors.

According to another aspect of the present invention, there is provided a high-frequency switch having, in addition to the above-mentioned elements, a third transmission line connected between the node of the first diode and the first transmission line and the node of the first and second resistors, wherein the second port is connected to the node between the first diode and the first transmission line, and the node between the first and second resistors is connected to a reference potential.

In the above-described high-frequency switches, at least one of the first and second control voltage terminals may be coupled to the respective one of the first and second resistors via an additional resistor. Also, at least one of the first through third ports may be coupled to a reference potential via a capacitor.

The afore-described high-frequency switches may further comprise a third resistor connected to one end of the first resistor and the node between the second transmission line and a reference potential and a fourth resistor connected to one end of the second resistor and the node between the second diode and a reference potential.

Further, a series circuit formed of a transmission line and a capacitor may be connected in parallel to at least one of the first and second diodes. Alternatively, a series circuit formed of a transmission line and a capacitor may be connected in parallel to at least one of the first and second diodes, and another capacitor may be further connected in parallel to the above-mentioned series circuit.

With the above arrangements, a forward bias voltage is applied to the first and second diodes during transmission, thus causing the diodes to be activated. Accordingly, a signal from the transmitting circuit is transmitted to the antenna via the first diode and then radiates from the antenna. Also, an impedance inverting circuit can be formed by causing the first transmission line to be grounded via the second diode and the capacitor. Accordingly, the impedance viewed from the antenna to the receiving circuit becomes very large, and thus, a transmitted signal from the transmitting circuit does not reach the receiving circuit. In contrast, during reception the first and second diodes are rendered ineffective, and thus, a received signal is conducted to the receiving circuit rather than to the transmitting circuit.

DESCRIPTION OF EMBODIMENTS OF THE INVENTION

Figure 1:
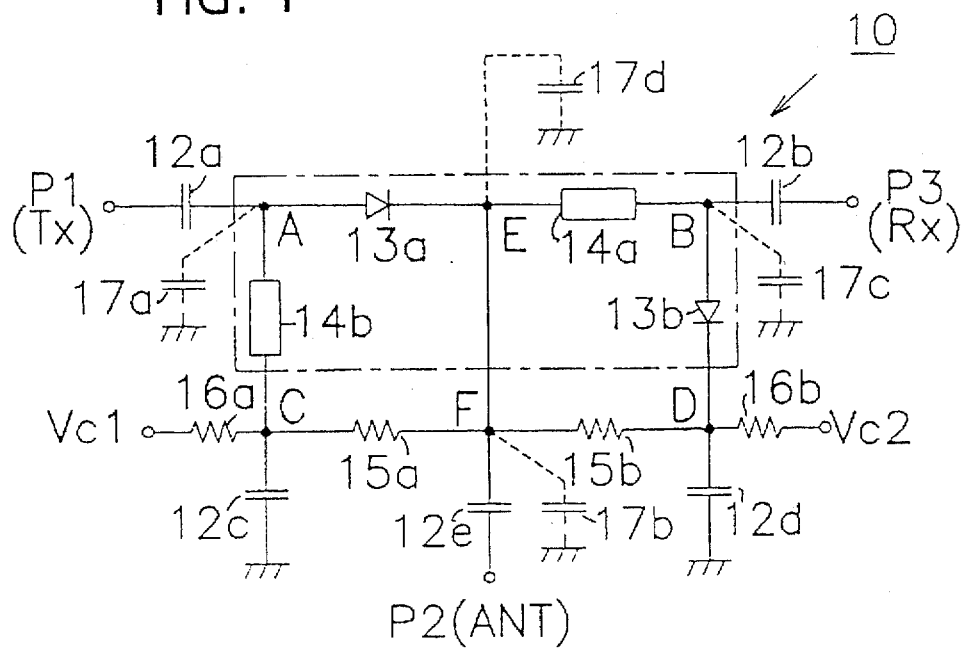
FIG. 1 is a circuit diagram of a first embodiment of a high-frequency switch according to the present invention.

Embodiments of the present invention will now be described with reference to the drawings. In the following description, elements that are the same as or correspond to those of a first embodiment are designated by like reference numerals in the subsequent embodiments, and an explanation thereof will thus be omitted.

FIG. 1 is a circuit diagram of a first embodiment of a high-frequency switch according to the present invention. In a high-frequency switch generally indicated by 10, a first port P1 is connected to a transmitting circuit Tx; a second port P2 is coupled to an antenna ANT; and a third port P3 is connected to a receiving circuit Rx. The anode of a first diode 13a is coupled to the transmitting circuit Tx through a capacitor 12a. A first transmission line 14a is connected at one end to the cathode of the first diode 13a and at the other end to the receiving circuit Rx across a capacitor 12b.

Further, a second transmission line 14b is coupled at one end to the node A between the first diode 13a and the capacitor 12a and at the other end to a reference potential, i.e., a ground potential, via a capacitor 12c. Also, the anode of a second diode 13b is connected to the node B between the first transmission line 14a and the capacitor 12b, while the cathode of the second diode 13b is connected to a ground potential via a capacitor 12d.

Moreover, a series circuit formed of first and second resistors 15a and 15b is connected between the node C of the second transmission line 14b and the capacitor 12c and the node D of the second diode 13b and the capacitor 12d.

A first control voltage terminal Vc1 is coupled through a resistor 16a to the node C between the second transmission line 14b and the capacitor 12c. A first control circuit for changing the switch 10 (not shown) is further connected to the first control voltage terminal Vc1. Also, a second control voltage terminal Vc2 is coupled across a resistor 16b to the node D between the second diode 13b and the capacitor 12d. A second control circuit for changing the switch 1 (unillustrated) is connected to the second control voltage terminal Vc2.

The node F between the first and second resistors 15a and 15b is connected to the antenna ANT via a capacitor 12e. The nodes E and F are directly coupled to each other.

With the above-described arrangement, the first and second transmission lines 14a and 14b are formed of striplines, microstrip lines, coplanar guide lines, or the like, all of the lines having a wavelength shorter than $\lambda/4$ when the wavelength of a high-frequency signal transmitted to the switch 10 is represented by $\lambda$. The second transmission line 14b may be replaced by a high-impedance line. The first and second transmission lines 14a and 14b are what is referred to as "$\lambda/4$ lines". In practice, however, the lines 14a and 14b are configured to have a wavelength shorter than $\lambda/4$, as discussed above, due to the floating capacitance and the inductance of the lines.

The operation of the high-frequency switch 10 constructed as described above will now be explained while referring to Table 1 illustrating the control operation. In Table 1, [V1 and V2] designate control voltages to be applied to the first and second control voltage terminals Vc1 and Vc2 (+indicates a positive control voltage, while 0 represents a ground voltage). [Tx-ANT] depicts the connecting state (open/closed) between the transmitting circuit port Tx and the antenna port ANT (O designates the connected (closed) state, while x indicates the disconnected (open) state). Likewise, [ANT-Rx] represents the connecting state (open/closed) between the antenna port ANT and the receiving circuit port Rx (O designates the connected (closed) state, while x indicates the disconnected (open) state).

TABLE 1

| Connecting state | V1 | V2 | Tx-ANT | ANT-Rx |
| --- | --- | --- | --- | --- |
| First | + | 0 | o | x |
| Second | 0 | + | x | o |

For transmission, a positive voltage is applied to the first control voltage terminal Vc1, while a ground potential, i.e., 0 [V], is applied to the second control voltage terminal Vc2. At this time, the capacitors 12a through 12f interrupt the flow of direct current, and thus, the voltage applied to the first control voltage terminal Vc1 is applied only to the circuit including the first and second diodes 13a and 13b. This causes the first and second diodes 13a and 13b to be activated. Simultaneously, a signal from the transmitting circuit Tx is transmitted to the antenna ANT and then radiates from the antenna ANT. Also, an impedance inverting circuit is formed by causing the first transmission line 14a to be grounded via the second diode 13b and the capacitor 12d. Accordingly, the impedance viewed from the node E between the cathode of the first diode 13a and the first transmission line 14a to the receiving circuit Rx is caused to become very large. As a result, the transmitted signal from the transmitting circuit Tx is not sent to the receiving circuit Rx.

Conversely, for reception, 0 [V] is applied to the first control voltage terminal Vc1, while a positive voltage is applied to the second control voltage terminal Vc2, so as to cause the first and second diodes 13a and 13b to be ineffective. A received signal is thus transmitted to the receiving circuit Rx rather than to the transmitting circuit Tx. It should be noted that the first and second resistors 15a and 15b are provided for stabilizing the capacitances produced by reverse-biasing the first and second diodes 13a and 13b, respectively, during reception.

In this manner, regulated voltages can be applied to the first and second voltage terminals Vc1 and Vc2, thereby changing between the transmitting and receiving operations performed by this switch 10.

Figure 2:
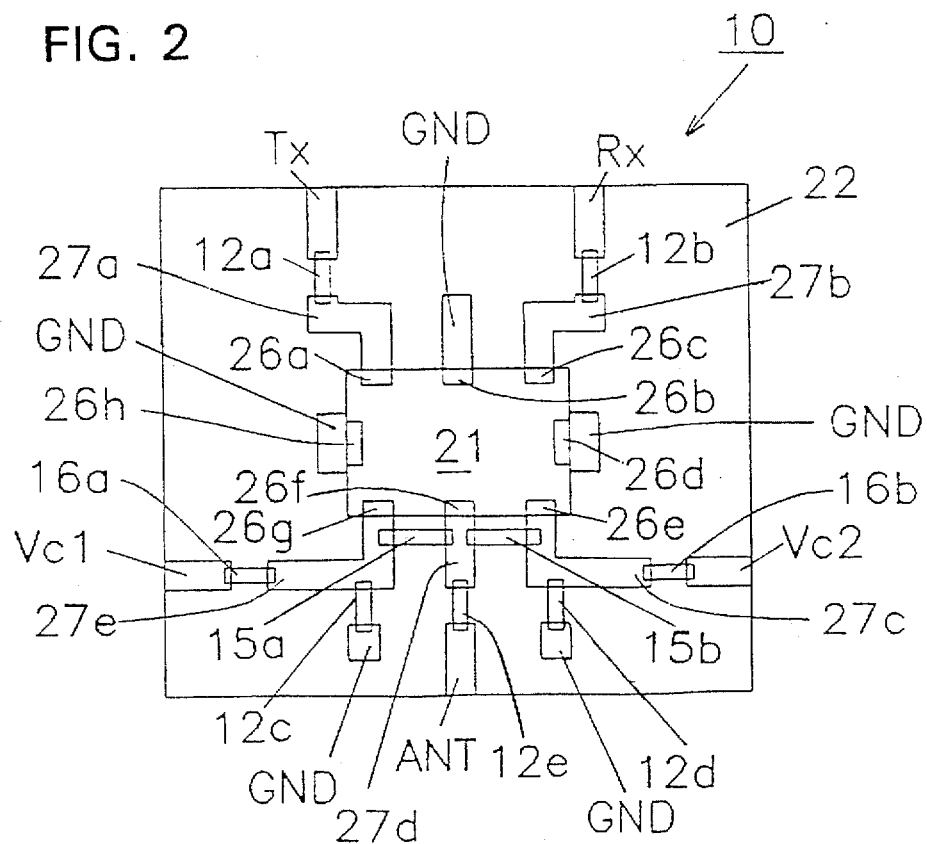
FIG. 2 is a top view of the high-frequency switch shown in FIG. 1.

FIG. 2 is a top view of the high-frequency switch 10. In this switch 10, mounted on a circuit board 22 are a multi-layered substrate 21 into which a portion defined by a one-dot-chain line shown in FIG. 1 is integrated, the capacitors 12a through 12e, and the first and second resistors 15a and 15b.

Figure 3:
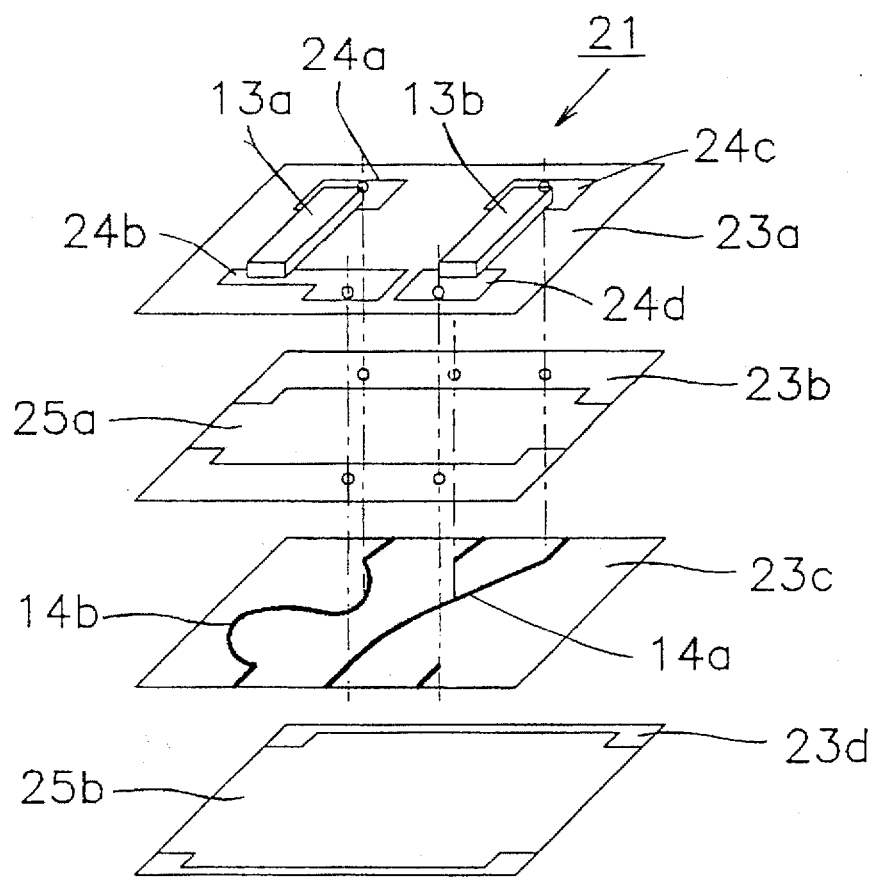
FIG. 3 is an exploded perspective view of a multilayered substrate used for the high-frequency switch shown in FIG. 1.

This multilayered substrate 21 is formed, as shown in FIG. 3, by stacking a plurality of dielectric layers 23a through 23d. Formed on the dielectric layer 23a, which is the uppermost layer, are four lands 24a through 24d. The first diode 13a is mounted on the lands 24a and 24b, while the second diode 13b is mounted on the lands 24c and 24d. A first ground electrode 25a is disposed on the dielectric layer 23b, which is the second layer from the top. Further, the first transmission lines 14a and 14b are formed on the dielectric layer 23c, which is the third layer from the top, and a second ground electrode 25b is disposed on the dielectric layer 23d, which is the lowermost layer.

With this arrangement, the anode of the first diode 13a is connected to one end of the second transmission line 14b through the land 24a formed on the dielectric layer 23a and via holes formed in the dielectric layers 23a and 23b. The cathode of the first diode 13a is coupled to one end of the first transmission line 14a through the land 24b formed on the dielectric layer 23a and via holes formed in the dielectric layers 23a and 23b. In contrast, the anode of the second diode 13b is connected to the other end of the first transmission line 14a through the land 24c formed on the dielectric layer 23a and via holes formed in the dielectric layers 23a and 23b.

Disposed on the top surface and the lateral surfaces of the substrate 21 are, as illustrated in FIG. 2, eight external electrodes 26a through 26h. Moreover, lands 27a through 27e to be connected to the external electrodes 26a through 26h are formed on the mounting board 22.

Among the external electrodes 26a through 26h, the electrode 26a is coupled to one end of the second transmission line 14b and is further connected to the transmitting circuit Tx through the land 27a and the capacitor 12a. Also, the external electrode 26b is coupled to a ground terminal GND. The electrode 26c is connected to the other end of the first transmission line 14a and is further coupled to the receiving circuit Rx across the land 27c and the capacitor 12b. Moreover, the electrodes 26d and 26h are connected to the first and second ground electrodes 25a and 25b, respectively, and are coupled to ground terminals GND. Further, the electrode 26e is connected to the cathode of the second diode 13b and is further coupled to a ground terminal GND via the land 27c and the capacitor 12d. The electrode 26e is then used as the second control voltage terminal Vc2 through the land 27d and the resistor 16b. The electrode 26f is connected to one end of the first transmission line 14a and is further coupled to the antenna ANT through the land 27a and the capacitor 12e. Further, the electrode 26g is connected to the other end of the second transmission line 14b and is further coupled to a ground terminal GND via the land 27e and the capacitor 12c. The electrode 26g is then used as the first control voltage terminal Vc1 through the land 27f and the resistor 16a. The resistor 15a is connected between the lands 27d and 27e, while the resistor 15b is coupled between the lands 27c and 27d.

According to the afore-described construction, the high-frequency switch 10 having the circuit shown in FIG. 1 can be formed.

Figure 4:
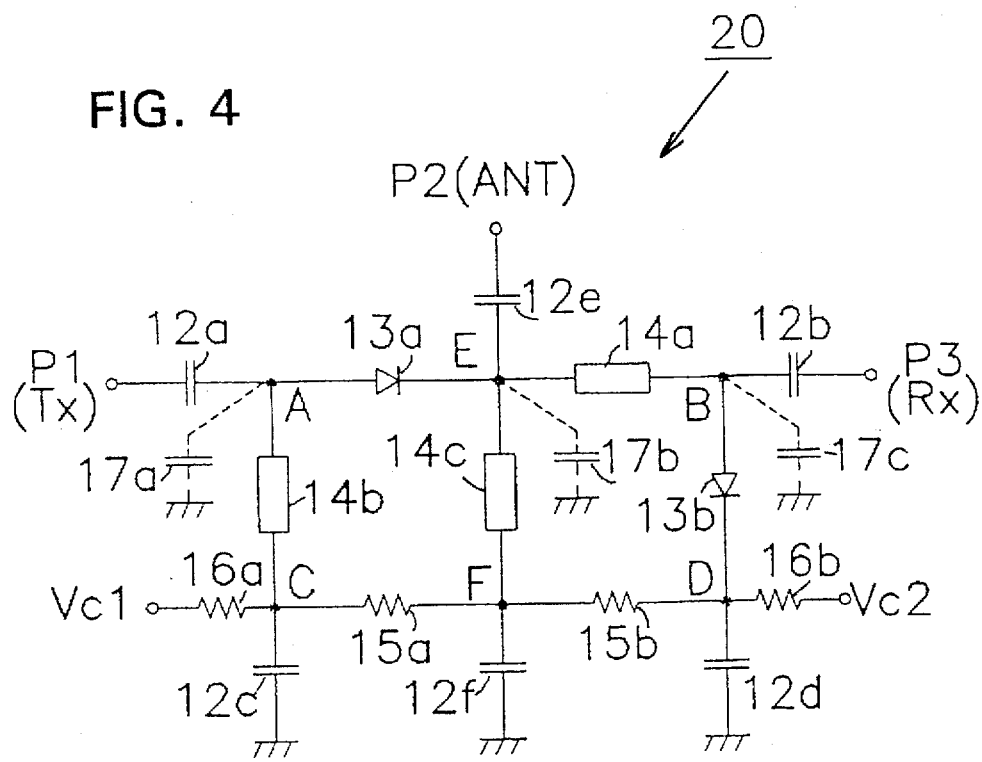
FIG. 4 is a circuit diagram of a second embodiment of a high-frequency switch according to the present invention.

FIG. 4 is a circuit diagram of a second embodiment of a high-frequency switch according to the present invention. A high-frequency switch generally designated by 20 is different from the high-frequency switch 10 of the first embodiment in the following points. The antenna ANT is connected through the capacitor 12e to the node E between the first diode 13a and the first transmission line 14a; the node F between the first and second resistors 15a and 15b is coupled to a ground potential via a capacitor 12f; and a third transmission line 14c is connected between the nodes E and F.

With this construction, the first through third transmission lines 14a through 14c are formed of striplines, microstrip lines, coplanar guide lines, or the like, all of the lines having a wavelength shorter than $\lambda/4$ when the wavelength of a high-frequency signal supplied to the high-frequency switch 20 is represented by $\lambda$. The second and third transmission lines 14b and 14c may be replaced by high-impedance lines. The first through third transmission lines 14a through 14c are what is referred to as "$\lambda/4$ lines". In practice, however, the lines 14a through 14c are configured to have a wavelength shorter than $\lambda/4$, as described above, due to the floating capacitance and the inductance of the lines.

The operation of the high-frequency switch 20 constructed as described above is similar to that of the switch 10 indicated by Table 1.

According to the above description, in the high-frequency switches 10 and 20 of the first and second embodiments, it is possible to dispose resistors at positions away from the diodes, unlike the conventional type of high-frequency switch in which resistors are required to be connected in parallel to the diodes. This increases the flexibility of designing the circuit configuration. Also, resistors can be separated from the signal paths so as to increase the Q factor, thereby lowering insertion losses of the high-frequency switches. Further, resistors can be directly mounted on a circuit board without having to be mounted on or integrated into a multilayered substrate, thereby decreasing the cost and size of the substrate. Additionally, the elements forming the switches, other than the resistors, can be completely or partly mounted on or integrated into the substrate, thereby enabling a decrease in the cost and size of the substrate.

In this invention, a ground potential may be applied instead of a positive control voltage, and a negative control voltage may be applied in place of a ground potential. In this case, in the above-described first connecting state shown in Table 1, a ground potential, i.e., 0 [V], is applied to the first control voltage terminal Vc1, while a negative control voltage is applied to the second control voltage terminal Vc2. The same applies to the implementation of the second connecting state.

The directions of the first and second diodes 13a and 13b are not limited to those of the first and second embodiments illustrated in FIGS. 1 and 4. They may be reversed. More specifically, the first diode 13a may be connected at its anode to the first transmission line 14a and at its cathode to the capacitor 12a. The second diode 13b may be coupled at its anode to the capacitor 12d and at its cathode to the first transmission line 14a. In this case, since the polarities of the first and second diodes 13a and 13b are reversed, it is also required that the positive control voltage and the ground potential to be applied to the first and second control voltage terminals be reversed in Table 1.

Moreover, the resistors 16a and 16b may be omitted as required, in which case, the nodes C and D may be directly connected to the first and second control voltage terminals Vc1 and Vc2, respectively. The resistors 16a and 16b are provided to adjust the control voltages to be applied to the switch via the nodes C and D from the first and second control voltage terminals Vc1 and Vc2, respectively. Thus, they may be omitted as required.

Additionally, the capacitors 12a through 12f, which serve to eliminate bias voltages, may be omitted as required.

An explanation will now be given of a first example of a modification of the high-frequency switches 10 and 20. As indicated by the broken lines in FIGS. 1 and 4, capacitors 17a through 17d may be preferably connected between the first through the third ports P1 through P3 and reference potentials, respectively. In this case, the capacitances of the capacitors 17a through 17d can be determined to correct the characteristic impedance, thereby effectively reducing insertion losses and reflection losses of the high-frequency switches 10 and 20. Additionally, these capacitances enable the first through third transmission lines 14a through 14c to be shortened, thereby enhancing the downsizing of the switches 10 and 20. Not all of the capacitors 17a through 17d are necessarily used. Thus, only some of them may be connected to the corresponding portions of the switches 10 and 20 as required.

Figure 5:
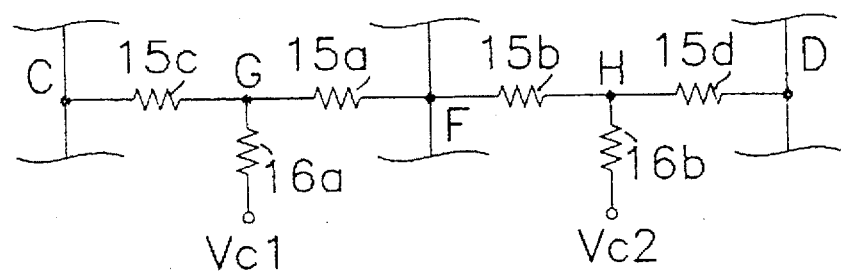
FIG. 5 is a circuit diagram illustrating an example of a modification of the high-frequency switch.

A description will further be given of a second example of a modification of the high-frequency switches 10 and 20, referring to FIG. 5. More preferably, a series circuit formed of the first and third resistors 15a and 15c may be connected between the nodes C and F, while a series circuit formed of the second and fourth resistors 15b and 15d may be coupled between the modes D and F. Then, the first control voltage terminal Vc1 may be connected via the resistor 16a to the node G between the first and third resistors 15a and 15c, while the second control voltage terminal Vc2 may be coupled through the resistor 16b to the node H between the second and fourth resistors 15b and 15d. With this configuration, the third and fourth resistors 15c and 15d specify the voltages to be applied to the first and second diodes 13a and 13b, respectively, during transmission, so as to stabilize the capacitance generated by reverse-biasing.

Figure 6:
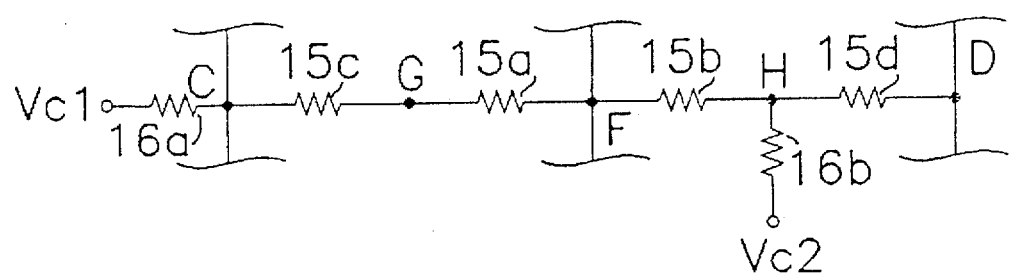
FIG. 6 is a circuit diagram illustrating a second example of a modification of the high-frequency switch.

To further develop the second example of a modification, another example is shown in FIG. 6. In this example, the first control voltage terminal Vc1 may be connected to the node C through the resistor 16a, while the second control voltage terminal Vc2 may be coupled to the node H across the resistor 16b. In this example, advantages similar to those achieved by the second example of a modification illustrated in FIG. 5 can also be obtained.

It should be noted that in an alternate example of a modification (not shown), the first control voltage terminal Vc1 may be connected to the node G and the second control voltage terminal Vc2 may be coupled to the node D. In this case as well, advantages similar to those realized by the second example of a modification shown in FIG. 5 can be obtained.

Figure 7:
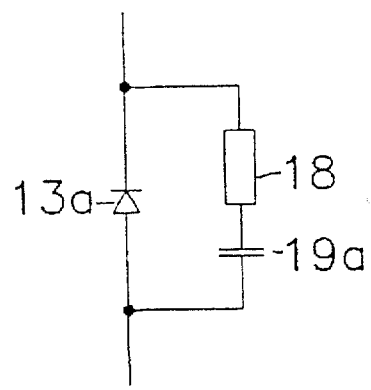
FIG. 7 is a circuit diagram illustrating a third example of a modification of the high-frequency switch.
Figure 8:
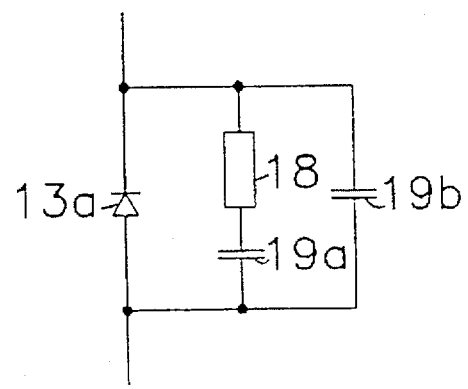
FIG. 8 is a circuit diagram illustrating a fourth example of a modification of the high-frequency switch.
Figure 9:
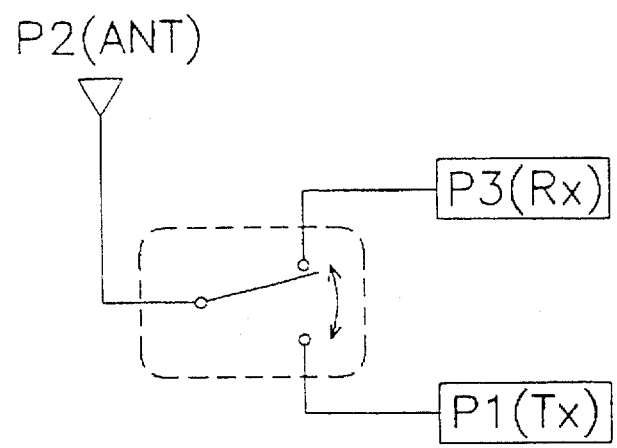
FIG. 9 is a schematic diagram illustrating the operation of a known high-frequency switch.
Figure 10:
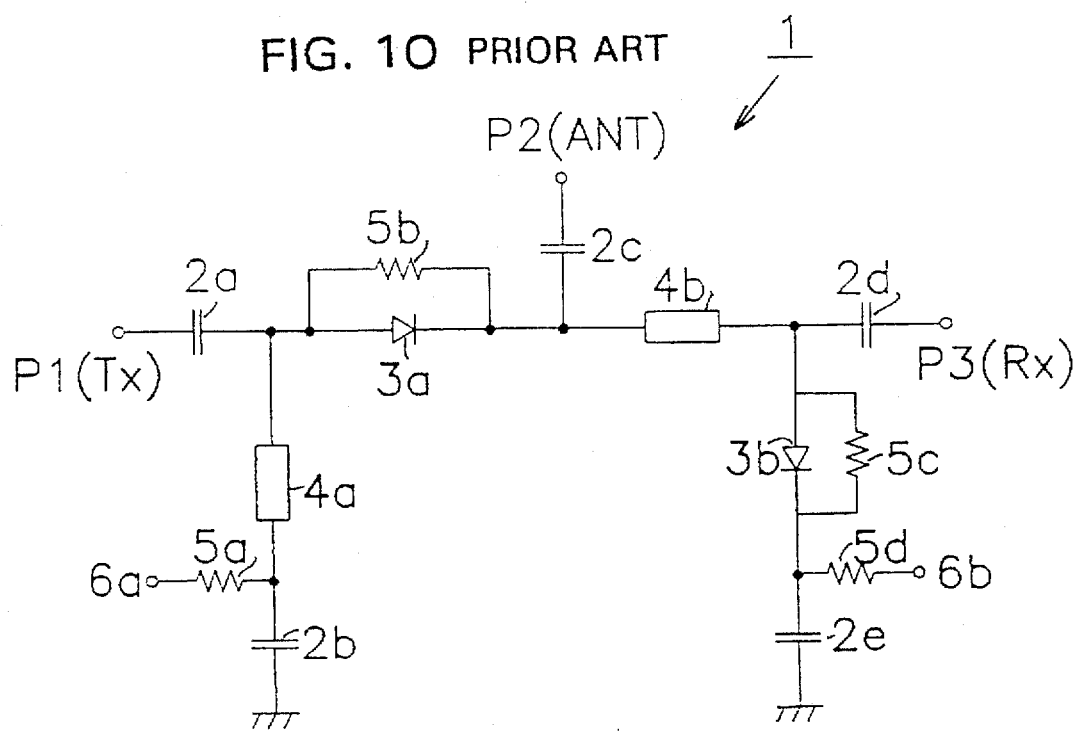
FIG. 10 is a circuit diagram of a high-frequency switch of a known type.

An explanation will further be given of third and fourth examples of modifications of the high-frequency switches 10 and 20 while referring to FIGS. 7 and 8. In these examples, additional circuit devices may be connected either to the first diode 13a or to the second diode 13b. The explanation will describe the devices connected to the first diode 13a by way of example.

In the third example of a modification, as illustrated in FIG. 7, a series circuit formed of a transmission line 18 and a capacitor 19a may be coupled in parallel to the first diode 13a. With this arrangement, a parallel resonance circuit can be formed by a capacitance of the inactivated first diode 13a and an inductance of the transmission line 18. Accordingly, the inductance of the transmission line 18 can be determined to match the resonant frequency of the parallel resonance circuit to the frequency of a high-frequency signal to be transmitted to the switch 10 or 20, thereby enhancing the impedance of the first diode 13a in the inactivated state. As a consequence, the isolation characteristics of the first diode 13a in the inactivated state can be improved. The capacitor 19a is provided for preventing the bypassing of a direct current flowing via the transmission line 18.

The transmission line 18 is formed of a stripline, a microstrip line, a coplanar guide line or the like, and the length and impedance of the line 18 are determined so that the resonant frequency of the parallel resonance circuit can match the frequency of a high-frequency signal. The transmission line 18 may be replaced with a high-impedance line.

To further develop the third example of a modification, the fourth example is provided. That is, if the capacitance of the first diode 13a is too small to obtain a desired resonant frequency, a capacitor 19b is coupled, as illustrated in FIG. 8, in parallel to the series circuit formed of the transmission line 18 and the capacitor 19a connected to the first diode 13a. With this configuration, a parallel resonance circuit can be formed by the combined capacitance of the inactivated first diode 13a and the capacitor 19b and an inductance of the transmission line 18a, thereby obtaining a desired resonant frequency.

It should be noted that the first through fourth examples of modifications may be combined with each other.

As will be clearly understood from the foregoing description, the high-frequency switch of the present invention offers the following advantages.

Resistors can be disposed at positions away from the diodes, unlike in the conventional type of high-frequency switch, in which resistors are required to be connected in parallel to the diodes. Hence, the flexibility of designing the circuit configuration can be increased. Also, the resistors can be separated from the signal paths so as to increase the Q factor, thereby lowering the insertion losses of the switch.

Further, resistors can be mounted on a circuit board without needing to be mounted on or integrated into a multilayered substrate, thereby decreasing the cost and size of the substrate. Additionally, the elements other than the resistors constituting the switch can be completely or partly mounted on or integrated into a multilayered substrate, thereby enabling a decrease in the cost and size of the substrate.

If an additional resistor is connected to each of the first and second control voltage terminals, the resistance of the resistor can be determined to readily adjust the control voltages and the control currents at the first and second control voltage terminals.

Further, if a capacitor is connected between each of the first through third ports and a reference potential, the capacitance of the capacitor can be selected to correct the characteristic impedance. This can effectively reduce insertion losses and reflection losses of the switch. Additionally, the first through third transmission lines can be shortened, thereby enhancing the downsizing of the high-frequency switch.

If third and fourth resistors are added to the first and second resistors, they can specify voltages to be applied to the first and second diodes during transmission, and thus stabilize the capacitance produced by reverse biasing.

If a series circuit formed of a transmission line and a capacitor is connected in parallel to one of the first and second diodes, a parallel resonance circuit can be formed by a capacitance of the diode in the de-energized state and an inductance of the transmission line. The inductance of the line can be determined to match the resonant frequency of the parallel resonance circuit to the frequency of a high-frequency signal to be transmitted to the switch, thereby improving the impedance of the diode when it is de-energized. As a consequence, isolation characteristics can be enhanced. Additionally, the capacitor connected in series to the transmission line can avoid the bypassing of a direct current flowing into a circuit portion including the transmission line.

If an extra capacitor is connected in parallel to the above-described series circuit formed of the transmission line and the capacitor coupled to one of the first and second diodes, a parallel resonance circuit can be formed by the combined capacitance of the inactivated diode and the capacitor connected in parallel to the diode and the inductance of the transmission line. It is thus possible to achieve a desired resonant frequency and to also improve the isolation characteristics.

What is claimed is:

1. A high-frequency switch having first through third ports wherein the second port can be connected either to the first port or to the third port, said high-frequency switch comprising:

a series circuit formed of a first transmission line and a first diode which is connected between the first and third ports;

a second transmission line connected between a reference potential and a node between the first port and said first diode;

a second diode connected between a reference potential and a node between the third port and said first transmission line;

a series circuit formed of first and second resistors connected between a node between said second transmission line and the reference potential, and a node between said second diode and the reference potential;

a first control voltage terminal connected to one end of said first resistor; and a second control voltage terminal connected to one end of said second resistor, wherein a node between said first diode and said first transmission line is connected to a node between said first and second resistors and to said second port.

2. A high-frequency switch according to claim 1, wherein at least one of said first and second control voltage terminals is coupled to the corresponding end of said one of said first and second resistors via an additional resistor.

3. A high-frequency switch according to claim 1, further comprising a third resistor connected to said one end of said first resistor and said node between said second transmission line and a reference potential, and a fourth resistor connected to said one end of said second resistor and said node between said second diode and a reference potential.

4. A high-frequency switch according to claim 3, wherein at least one of said first and second control voltage terminals is coupled to the corresponding end of said one of said first and second resistors via an additional resistor.

5. A high-frequency switch according to claim 1, wherein at least one of the first through third ports is coupled to a reference potential via a capacitor.

6. A high-frequency switch according to claim 1, wherein a series circuit of a transmission line and a capacitor is connected in parallel with at least one of said first and second diodes.

7. A high-frequency switch according to claim 1, wherein a series circuit formed of a transmission line and a capacitor is connected in parallel to at least one of said first and second diodes, and another capacitor is further connected in parallel to said series circuit.

8. A high-frequency switch having first through third ports wherein the second port can be connected either to the first port or to the third port, said high-frequency switch comprising:

a series circuit formed of a first transmission line and a first diode which is connected between the first and third ports;

a second transmission line connected between a reference potential and a node between the first port and said first diode;

a second diode connected between a reference potential and a node between the third port and said first transmission line;

a series circuit formed of first and second resistors connected between a node between said second transmission line and the reference potential, and a node between said second diode and the reference potential;

a third transmission line connected between a node between said first diode and said first transmission line and a node between said first and second resistors;

a first control voltage terminal connected to one end of said first resistor; and a second control voltage terminal connected to one end of said second resistor, wherein said second port is connected to the node between said first diode and said first transmission line, and a node between said first and second resistors is connected to a reference potential.

9. A high-frequency switch according to claim 8, wherein at least one of said first and second control voltage terminals is coupled to the corresponding end of said one of said first and second resistors via an additional resistor.

10. A high-frequency switch according to claim 8, further comprising a third resistor connected to said one end of said first resistor and said node between said second transmission line and a reference potential, and a fourth resistor connected to said one end of said second resistor and said node between said second diode and a reference potential.

11. A high-frequency switch according to claim 10, wherein at least one of said first and second control voltage terminals is coupled to the corresponding end of said one of said first and second resistors via an additional resistor.

12. A high-frequency switch according to claim 8, wherein at least one of the first through third ports is coupled to a reference potential via a capacitor.

13. A high-frequency switch according to claim 8, wherein a series circuit of a transmission line and a capacitor is connected in parallel with at least one of said first and second diodes.

14. A high-frequency switch according to claim 8, wherein a series circuit formed of a transmission line and a capacitor is connected in parallel to at least one of said first and second diodes, and another capacitor is further connected in parallel to said series circuit.

\* \* \* \* \*